US012481386B2

(12) United States Patent
Huang et al.

(10) Patent No.: US 12,481,386 B2
(45) Date of Patent: *Nov. 25, 2025

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Weiyun Huang, Beijing (CN); Longhui Xue, Beijing (CN); Yue Long, Beijing (CN); Wei Zhang, Beijing (CN); Xingliang Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/762,768

(22) Filed: Jul. 3, 2024

(65) Prior Publication Data

US 2024/0353945 A1 Oct. 24, 2024

Related U.S. Application Data

(63) Continuation of application No. 17/993,046, filed on Nov. 23, 2022, now Pat. No. 12,073,037, which is a
(Continued)

(30) Foreign Application Priority Data

Dec. 20, 2019 (CN) .......................... 201911333470.9

(51) Int. Cl.
G06F 3/041 (2006.01)

(52) U.S. Cl.
CPC .. *G06F 3/0412* (2013.01); *G06F 2203/04102* (2013.01)

(58) Field of Classification Search
None
See application file for complete search history.

(56) References Cited

U.S. PATENT DOCUMENTS 10,222,662 B2 3/2019 Shi
10,338,710 B2 7/2019 Li et al.
(Continued)

FOREIGN PATENT DOCUMENTS

CN 104866161 A 8/2015
CN 105511688 A 4/2016
(Continued)

OTHER PUBLICATIONS

Office Action dated May 7, 2022, issued in counterpart CN application No. 201911333470.9, with English translation. (18 pages).
(Continued)

*Primary Examiner* — Brian M Butcher
(74) *Attorney, Agent, or Firm* — WHDA, LLP

(57) ABSTRACT

A display panel includes: a pixel driving circuit layer, an anode layer, a light emitting layer, a cathode layer, an encapsulation layer and a touch function layer sequentially disposed on a base substrate. The display panel includes a plurality of light transmitting regions and a plurality of pixel cell regions, a plurality of traces of the pixel driving circuit layer are connected between adjacent pixel cell regions, and there are slits between adjacent traces. An orthographic projection of a wiring of the touch function layer on the base substrate overlaps with that of the slits on the base substrate. The display panel includes a second display region including the plurality of light transmitting regions and the plurality of pixel cell regions and a first display region. The number of
(Continued)

pixel cells per unit area in the first display region is greater than that in the second display region.

19 Claims, 5 Drawing Sheets

Related U.S. Application Data continuation of application No. 16/905,108, filed on Jun. 18, 2020, now Pat. No. 11,543,903.

(56) References Cited

U.S. PATENT DOCUMENTS

| | | | |
|---|---|---|---|
| 10,712,855 | B2 | 7/2020 | Ma et al. |
| 10,756,136 | B1 | 8/2020 | Ma et al. |
| 11,216,099 | B2 | 1/2022 | Zhang et al. |
| 11,249,569 | B2 | 2/2022 | Ye |
| 11,543,903 | B2 | 1/2023 | Huang et al. |
| 12,073,037 | B2 * | 8/2024 | Huang ............ G06F 3/0412 |
| 2012/0120020 | A1 | 5/2012 | Lee |
| 2014/0085214 | A1 | 3/2014 | Cok |
| 2014/0312321 | A1 * | 10/2014 | Yoo ............ H04N 23/71 257/40 |
| 2017/0220148 | A1 | 8/2017 | Zhou et al. |
| 2019/0050100 | A1 | 2/2019 | Ma et al. |
| 2019/0081118 | A1 * | 3/2019 | Oh ............ H10K 77/10 |
| 2019/0179466 | A1 | 6/2019 | Kim et al. |
| 2019/0187844 | A1 | 6/2019 | Ye |
| 2019/0204964 | A1 | 7/2019 | Wang et al. |
| 2020/0379295 | A1 | 12/2020 | Wei et al. |
| 2021/0011571 | A1 | 1/2021 | Zhang et al. |
| 2023/0081895 | A1 | 3/2023 | Huang et al. |

FOREIGN PATENT DOCUMENTS

| | | |
|---|---|---|
| CN | 205670226 U | 11/2016 |
| CN | 108054193 A | 5/2018 |
| CN | 207780741 U | 8/2018 |
| CN | 108628047 A | 10/2018 |
| CN | 110061014 A | 7/2019 |
| CN | 110164951 A | 8/2019 |
| CN | 110349976 A | 10/2019 |
| KR | 20170139486 A | 12/2017 |

OTHER PUBLICATIONS

Non-Final Office Action dated Oct. 27, 2021, issued in U.S. Appl. No. 16/905,108 (11 pages).

Final Office Action dated Feb. 17, 2022, issued in U.S. Appl. No. 16/905,108 (11 pages).

Notice of Allowance dated Sep. 7, 2022, issued in U.S. Appl. No. 16/905,108 (11 pages).

Non-Final Office Action dated Mar. 14, 2023, issued in U.S. Appl. No. 17/993,046 (27 pages).

Office Action dated Oct. 31, 2023, issued in counterpart CN Application No. 202310418030.3, with English translation. (13 pages).

Non-Final Office Action dated Dec. 6, 2023, issued in U.S. Appl. No. 17/993,046 (11 pages).

Notice of Allowance dated May 1, 2024, issued in U.S. Appl. No. 17/993,046 (9 pages).

Final Office Action dated Sep. 8, 2023, issued in U.S. Appl. No. 17/993,046 (10 pages).

Non-Final Office Action dated Jul. 2, 2024, issued in U.S. Appl. No. 18/340,135 (29 pages).

* cited by examiner

DISPLAY PANEL AND DISPLAY DEVICE

CROSS-REFERENCE TO RELATED APPLICATION

This application is a continuation application of U.S. patent application Ser. No. 17/993,046 filed on Nov. 23, 2022, which is a continuation application of U.S. patent application Ser. No. 16/905,108 filed on Jun. 18, 2020, which claims priority to Chinese Patent Application No. 201911333470.9 filed on Dec. 20, 2019 in China National Intellectual Property Administration, the disclosures of which are incorporated herein by reference in entireties.

TECHNICAL FIELD

Embodiments of the present disclosure relate to the field of display technology, and in particular, to a display panel and a display device.

BACKGROUND

With the development of technology, the market demand for display panels with high screen-to-body ratios is becoming more and more urgent, and display panels are developing towards full-screen, thin and light product. The realization of full-screen display panel cannot be achieved without the in-screen camera technology, that is, the camera is located right below the display panel. When the imaging function is not required, the display panel in the camera region emits light normally as other regions of the display panel. When the imaging function is required, the camera region has the normal imaging function.

SUMMARY

In a first aspect, a display panel is provided, including: a first display region and a second display region, the second display region includes a plurality of light transmitting regions and a plurality of pixel cell regions, a first trace region is disposed in a first direction, the first trace region is configured to connect adjacent pixel cell regions in the first direction, a second trace region is disposed in a second direction intersecting the first direction, and the second trace region is configured to connect adjacent pixel cell regions in the second direction; the display panel further includes: a base substrate and a touch function layer; in the second display region, the touch function layer includes a plurality of first touch function structures and a plurality of second touch function structures; a first touch function structure in the plurality of first touch function structures extends in the first direction and is located in the first trace region; a second touch function structure in the plurality of second touch function structures extends in the second direction and is located in the second trace region; the first touch function structure in the plurality of first touch function structures and the second touch function structure in the plurality of second touch function structures are structures located in a same layer; and an orthographic projection of the first touch function structure on the base substrate does not overlap with an orthographic projection of the second touch function structure on the base substrate.

According to the embodiments of the present disclosure, a pixel driving circuit layer is disposed on the base substrate; and the pixel driving circuit layer includes at least two first traces disposed apart from each other in the first trace region, and at least two second traces disposed apart from each other in the second trace region; and the first touch function structure overlaps with the at least two first traces and a first slit between two adjacent first traces, and the second touch function structure overlaps with the at least two second traces and a second slit between two adjacent second traces.

According to the embodiments of the present disclosure, the at least two first traces are configured to transmit a data signal or a power supply voltage signal to the pixel cell regions.

According to the embodiments of the present disclosure, the at least two second traces are configured to transmit a scan signal, a light emission control signal or a reference voltage signal to the pixel cell regions.

According to the embodiments of the present disclosure, the display panel further includes: an anode layer, a light emitting layer, a cathode layer and an encapsulation layer sequentially disposed on the pixel driving circuit layer, and the touch function layer is disposed on the encapsulation layer, each of the at least two first traces of the pixel driving circuit layer is connected between two adjacent pixel cell regions, and each of the at least two second traces of the pixel driving circuit layer is connected between two adjacent pixel cell regions; an orthographic projection of a wiring of the touch function layer on the base substrate overlaps with an orthographic projection of the first and second slits on the base substrate; and an area of the pixel cell regions in the first display region is greater than an area of the pixel cell regions in the second display region.

According to the embodiments of the present disclosure, in the second display region, the touch function layer further includes a plurality of third touch function structures; a third touch function structure in the plurality of third touch function structures surrounds a peripheral region of a pixel cell region in the plurality of pixel cell regions; the third touch function structures corresponding to two pixel cell regions adjacent in the first direction are electrically connected through the first touch function structure; the third touch function structures corresponding to two pixel cell regions adjacent in the second direction are electrically connected through the second touch function structure; the third touch function structure in the plurality of third touch function structures is electrically connected to two adjacent first touch function structures in the plurality of first touch function structures located on two opposite sides of the third touch function structure in the first direction, and the third touch function structure in the plurality of third touch function structures is electrically connected to two adjacent second touch function structures in the plurality of second touch function structures located on two opposite sides of the third touch function structure in the second direction; and a width of the first touch function structure in the plurality of first touch function structures in a direction perpendicular to an extension direction of the first touch function structure is greater than a width of the third touch function structure, and a width of the second touch function structure in the plurality of second touch function structures in a direction perpendicular to an extension direction of the second touch function structure is greater than the width of the third touch function structure.

According to the embodiments of the present disclosure, the plurality of touch function structures, the plurality of second touch function structures and the plurality of third touch function structures are located in the same layer.

According to the embodiments of the present disclosure, the third touch function structure includes a mesh shape.

According to the embodiments of the present disclosure, each of the plurality of pixel cell regions includes a plurality of sub-pixel regions.

According to the embodiments of the present disclosure, there are third slits between adjacent sub-pixel regions, and an orthographic projection of the third touch function structure on the base substrate overlaps with an orthographic projection of the third slits on the base substrate.

According to the embodiments of the present disclosure, each of the plurality of sub-pixel regions is provided with a light emitting element, and the light emitting element includes an anode, a light emitting layer and a cathode that are sequentially stacked.

According to the embodiments of the present disclosure, the second display region is a multiplexing region for imaging and displaying.

According to the embodiments of the present disclosure, the display panel is a flexible display panel.

According to the embodiments of the present disclosure, the number of pixel cell regions per unit area in the first display region is greater than the number of pixel cell regions per unit area in the second display region.

According to the embodiments of the present disclosure, the touch function layer comprises a plurality of first touch electrodes extending substantially in the first direction and a plurality of second touch electrodes extending substantially in the second direction, and the plurality of first touch electrodes and the plurality of second touch electrodes are formed with trace evading regions surrounding the sub-pixel regions.

According to the embodiments of the present disclosure, each third slit comprises a first sub-slit, a second sub-slit, and a third sub-slit, each sub-slit is located between adjacent sub-pixel regions, the fact that the orthographic projection of the touch function layer on the base substrate overlaps with an orthographic projection of the third slits on the base substrate refers to: in each trace evading region, an orthographic projection of the first touch electrodes on the base substrate overlaps with an orthographic projection of the first sub-slit and the second sub-slit connected to each other on the base substrate; or in each trace evading region, an orthographic projection of the first touch electrodes on the base substrate overlaps with an orthographic projection of the first sub-slit and the third sub-slit connected to each other on the base substrate; and in each trace evading region, an orthographic projection of the second touch electrodes on the base substrate overlaps with an orthographic projection of the second sub-slit and the third sub-slit connected to each other on the base substrate.

According to the embodiments of the present disclosure, in the trace evading regions, the first touch electrodes surround edges of the sub-pixel regions.

According to the embodiments of the present disclosure, in the trace evading regions, the second touch electrodes surround edges of the sub-pixel regions.

In another aspect, a display device is provided, including the display panel as described above; and a sensor disposed at a position corresponding to the second display region of the display panel and on a side of the base substrate away from a light exit side of the display panel, the sensor has a photosensitive surface which faces the display panel.

BRIEF DESCRIPTION OF THE DRAWINGS

Other features, purposes, and advantages of the present disclosure will become more apparent by reading the detailed description of the non-limiting embodiments made with reference to the following drawings.

DETAILED DESCRIPTION OF EMBODIMENTS

Figure 1:
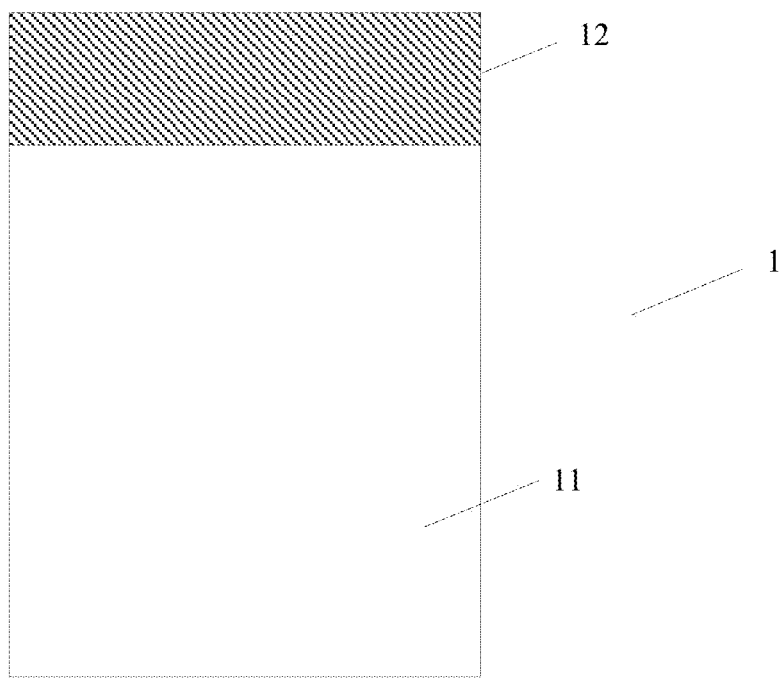
FIG. 1 is a schematic structural view of a display panel according to an embodiment of the present disclosure.

The present disclosure will be further described in detail below with reference to the drawings and embodiments. It can be understood that the specific embodiments described herein are only used to explain the present disclosure, rather than limiting the present disclosure. It should also be noted that, for ease of description, only the parts related to the present disclosure are shown in the drawings.

It should be noted that the embodiments and the features in the embodiments of the present disclosure may be combined with each other without conflict. The present disclosure will be described in detail below with reference to the drawings and in conjunction with the embodiments.

In the in-screen camera technology, the camera region requires a high light transmittance due to its imaging function, while the light transmittance of the normal light emitting region is far from meeting the needs of the camera. To this end, a "H+L" design is adopted, that is, the normal region uses a high PPI design, and the camera region uses a low PPI design. The light transmittance at the pixel cell is lower, and the light transmittance at the blank region between the pixels is higher. Therefore, the light transmittance of the low PPI region is higher, thereby the light transmittance of the camera region may be improved.

In addition, when the imaging and display functions are combined, the slits between signal traces in the display region will affect the imaging quality of the camera.

The embodiments of the present disclosure are expected to provide a display panel and a display device to improve the imaging quality of the imaging and the multiplexing region for imaging and displaying.

Referring to FIG. 1, which is a schematic structural view of a display panel according to an embodiment of the present disclosure.

The display panel 1 includes a first display region 11 and a second display region 12, each of which includes a plurality of pixel cell regions. The density of the pixel cells of the first display region 11 is greater than the density of the pixel cells of the second display region 12. That is, the number of pixel cells per unit area in the first display region 11 is greater than the number of pixel cells per unit area in the second display region 12, or the area of the pixel cell regions in a unit area of the first display region 11 is greater than the area of the pixel cell regions in a unit area of the second display region 12. The second display region 12 is as shown in FIG. 1, and its shape may be rectangular, circular, or other shapes. In one example, the second display region 12 is set to be a circle.

Figure 2:
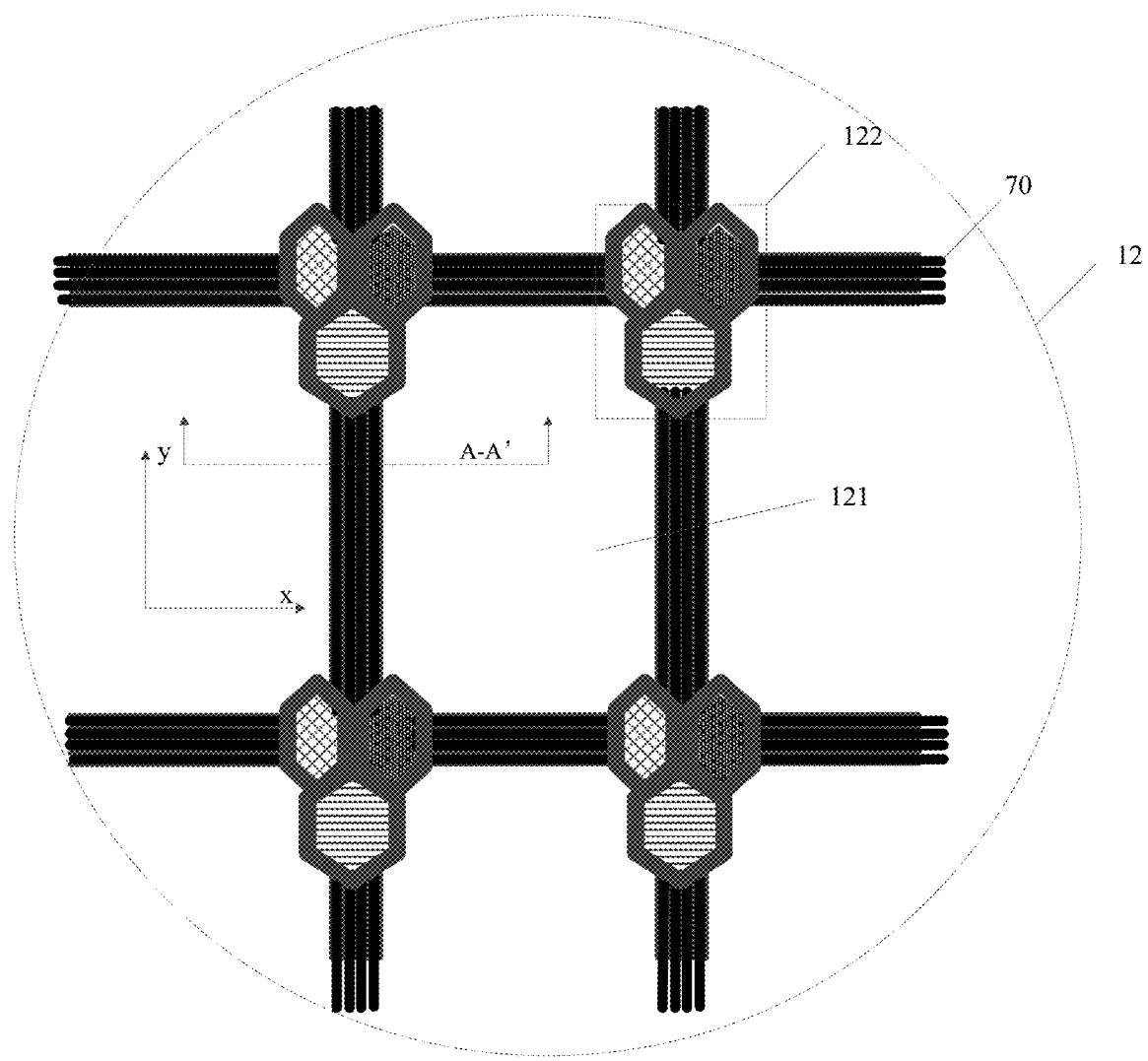
FIG. 2 is a schematic partial structural view of a second display region according to an embodiment of the present disclosure.

For the second display region 12, reference may be made to FIG. 2. FIG. 2 is a schematic partial structural view of a second display region according to an embodiment of the present disclosure.

As shown in FIG. 2, the second display region 12 includes a plurality of light transmitting regions 121 and a plurality of pixel cell regions 122. There are four pixel cell regions 122 around each light transmitting region 121. The light is transmitted to a sensor (for example, a camera) of the display panel through the light transmitting regions 121, and the sensor receives the light, thereby realizing the camera function. At the same time, pixel cell regions 122 are provided around the light transmitting region 121, and the pixel cell regions 122 enable the second display region to realize a display function. By combining the imaging and display functions in the second display region, the screen-to-body ratio of the display screen is effectively improved.

In order to realize the combination of imaging and display functions in the second display region, corresponding signal traces need to be provided between the pixel cell regions, and there are slits between these signal traces. In particular, for the second display region (camera region), low PPI should be guaranteed to ensure high light transmittance, and the traces are densely arranged around the pixels in this region, so that there is a blank region between the pixels. In this blank region, there is no shielding from traces, anodes, etc., therefore the light transmittance is higher. However, there are narrow slits between the traces. When incident light enters the display panel, these slits may cause light interference and diffraction problems, thereby affecting the imaging quality of the second display region. For example, column-direction data signal lines, power supply voltage signal lines, and the like are provided in a first direction y, row-direction scanning signal lines, light-emission control signal lines, reference voltage signal lines, and the like are provided in a second direction x.

In the embodiments of the present disclosure, in order to avoid interference and diffraction problems caused by these slits, which causes the imaging quality of the second display region is not high, these slits are shielded by a touch function layer, when the touch function layer 70 is manufactured. In this way, it effectively blocks light from entering the second display region through the slits, thereby improving the imaging quality of the second display region.

Figure 3:
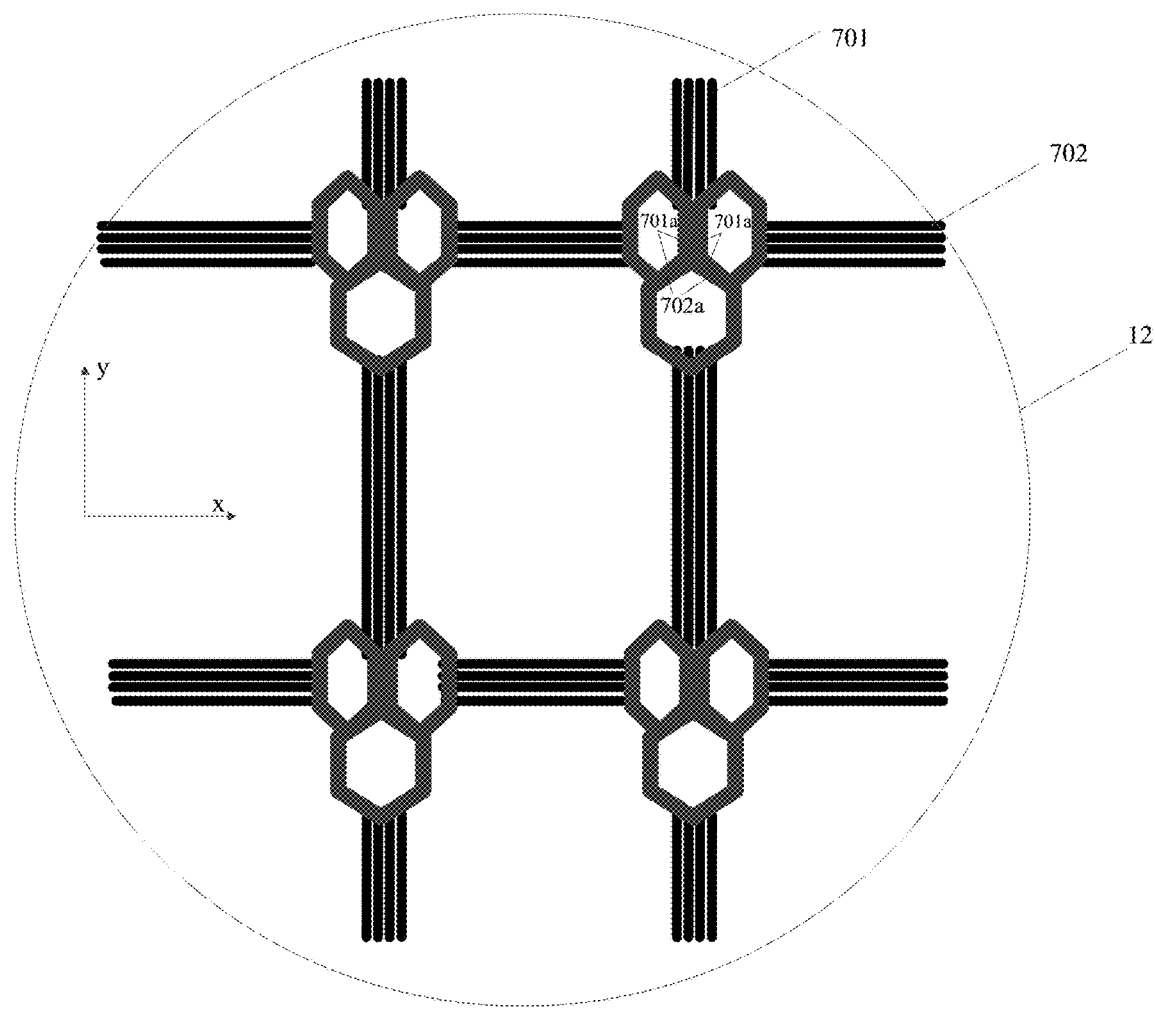
FIG. 3 is a schematic view showing a wiring manner of a touch function layer according to an embodiment of the present disclosure.

Based on the above embodiments, the touch function layer 70 includes a plurality of touch electrodes. Referring to FIG. 3, it is a schematic view showing a wiring manner of a touch function layer according to an embodiment of the present disclosure. As shown in FIG. 3, the touch function layer 70 includes a plurality of first touch electrodes 701 in a first direction and a plurality of second touch electrodes 702 in a second direction. The first touch electrodes and the second touch electrodes should evade anode regions corresponding to the sub-pixel regions in their extending direction, therefore the wiring method is defined as shown in FIG. 3. An approximately hexagonal trace evading region appears near the anode region. In the figure, it shows that the anode region has a hexagonal shape, but it may have other shapes. The embodiments of the present disclosure do not limit the shape of the anode region, as long as the wiring of the touch function layer does not cover the anode region. As for how to evade the anode region, it may be set according to actual wiring requirements.

The touch function layer 70 includes a plurality of first touch electrodes 701 extending in the first direction y, and a plurality of second touch electrodes 702 extending in the second direction x. The orthographic projections of the plurality of first touch electrodes 701 on the base substrate cover the orthographic projections of the plurality of first slits on the base substrate; the orthographic projections of the plurality of second touch electrodes on the base substrate cover the orthographic projections of the plurality of second slits on the base substrate. The first slits refer to the slits between the signal traces extending in the first direction, and the second slits refer to the slits between signal traces extending in the second direction.

Optionally, the orthographic projection of the touch function layer 70 on the base substrate 10 covers the orthographic projection of the third slits b on the base substrate, and it includes:

the orthographic projection of the trace evading region of the first touch electrode near the sub-pixel region on the base substrate 10 covers a part of the sub-slits among the plurality of sub-slits of the third slit.

The third slit refers to a slit in a region corresponding to the trace evading region, the third slit will be described later with reference to FIG. 5. The third slit b includes three sub-slits b1, b2, b3 in FIG. 5.

For example, the orthographic projection of the trace evading region 701a (first trace evading region) of the first touch electrode 701 near the sub-pixel region on the base substrate 10 just covers the orthographic projection of a part of the plurality of sub-slits of the third slit on the base substrate.

The orthographic projection of the trace evading region of the second touch electrode near the sub-pixel region on the base substrate 10 covers the remaining sub-slits among the plurality of sub-slits of the third slit.

For example, the orthographic projection of the trace evading region 702a (second trace evading region) of the second touch electrode 702 near the sub-pixel region on the base substrate 10 just covers the orthographic projection of another part of the plurality of sub-slits of the third slit on the base substrate.

Figure 4:
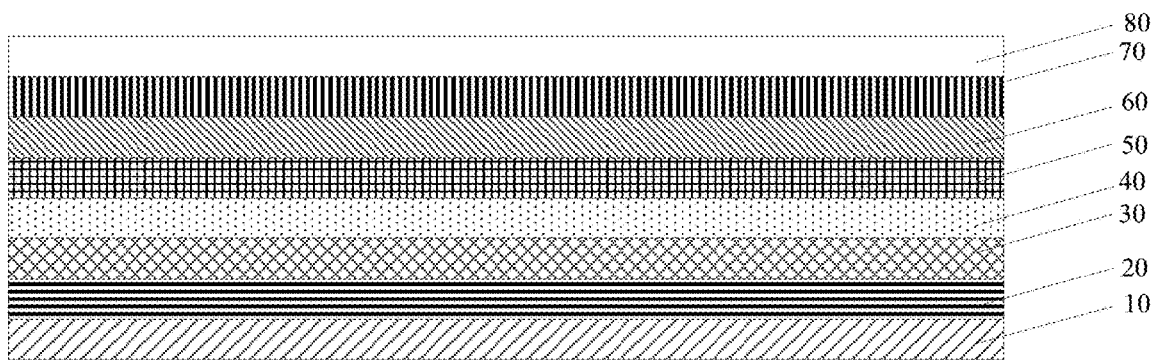
FIG. 4 is a schematic cross-sectional view of the display panel taken along a line A-A' in FIG. 2, according to an embodiment of the present disclosure.

For the distribution relationship between the touch function layer 70 and other function layers, reference may be made to FIG. 4. FIG. 4 is a schematic cross-sectional view of the display panel taken along a line A-A' in FIG. 2, according to an embodiment of the present disclosure. As an example, FIG. 4 shows a cross-sectional structure of a single sub-pixel region, a pixel driving circuit layer 20, an anode layer 30, a light emitting layer 40, a cathode layer 50, an encapsulation layer 60, a touch function layer 70, and a cover plate 80 are disposed in sequence above a base substrate 10. The touch function layer 70 may be FMLOC (Flexible Multiple Layer On Cell). The FMLOC includes first touch electrodes and second touch electrodes that are respectively arranged on the display panel in the first direction and the second direction orthogonal to each other, thereby realizing the detection of the touch position. The first touch electrodes are emission electrodes, and the second touch electrodes are receiving electrodes. Alternatively, the first touch electrodes are receiving electrodes, and the second touch electrodes are emission electrodes.

Figure 5:
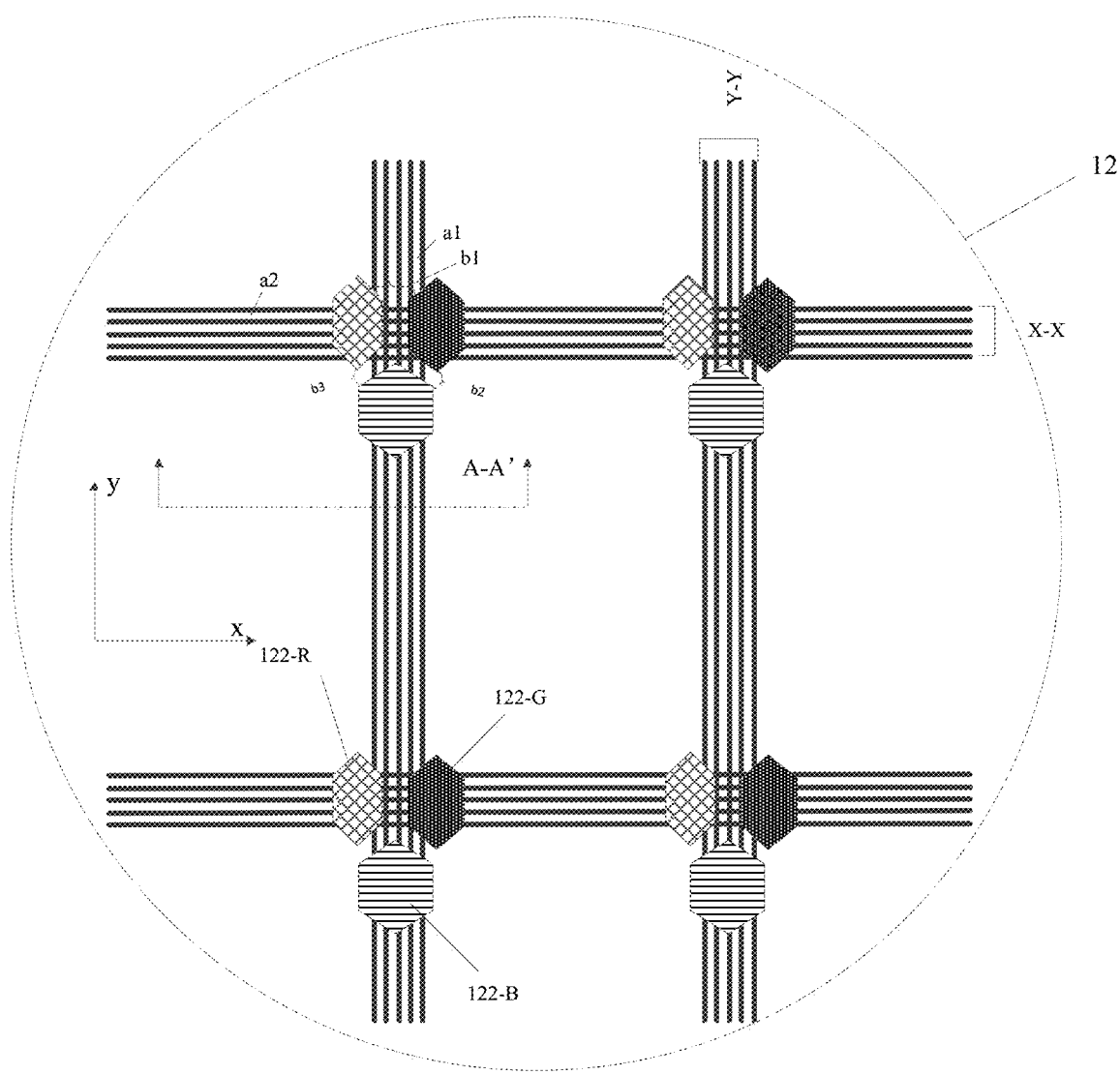
FIG. 5 is a schematic view showing slits in a second display region according to an embodiment of the present disclosure.

Optionally, in order to more clearly describe the shielding of the slits in the pixel driving circuit layer by the touch function layer 70 described in the embodiments of the present disclosure, reference may be made to FIG. 5, it is a schematic view showing slits in a second display region according to an embodiment of the present disclosure.

Each pixel cell region 122 includes a plurality of sub-pixel regions 122-R, 122-G, 122-B. A first trace region Y-Y is in the first direction y, the first trace region Y-Y connects adjacent pixel cell regions in the first direction, and the first trace region is used to transmit data signals and power supply voltage signals to the pixel cell regions. A second trace region X-X is in the second direction x, the second trace region X-X connects adjacent pixel cell regions in the second direction, and the second trace region is used to transmit scan signals, light emission control signals, reference voltage signals or the like to the pixel cell regions. Depending on the model of the drive circuit, the control signals transmitted in the first trace region and the control signals transmitted in the second trace region may be different, the schematic description is provided here, it is not intended to be construed as a limited explanation. The first direction y and the second direction x intersect each other.

A first slit a1 exists between two adjacent first traces in the first trace region Y-Y, and a second slit a2 exists between two adjacent second traces in the second trace region X-X. As shown in FIG. 5, the slits between the traces provided between the two pixel cell regions 122 may cause interference and diffraction problems when external light passes through the slits, thereby affecting the imaging effect of the second display region.

In order to solve this problem, the embodiment of the present disclosure adopts the touch function layer 70 to shield the first slit a1 and the second slit a2, to obtain the shielding relationship shown in FIG. 2. During the wiring design process, the position of the touch electrodes in the touch function layer 70 may be adjusted according to the width of gap (that is, the trace spacing) between the pixel driving circuit traces of the pixel driving circuit layer, or according to the position of the touch electrodes in the touch function layer.

Optionally, as shown in FIG. 5, each pixel cell region 122 of the display panel 1 includes a plurality of sub-pixel regions, and there are slits between adjacent sub-pixel regions. As shown in FIG. 5, the slit between two adjacent sub-pixel regions is the third slit b. The third slit b may include three sub-slits b1, b2, b3. The first sub-slit b1 is located between the sub-pixel regions 122-R and 122-G, the second sub-slit b2 is located between the sub-pixel regions 122-G and 122-B, and the third sub-slit b3 is located between the sub-pixel regions 122-B and 122-R. In the embodiments of the present disclosure, when the wiring is implemented on the touch function layer 70 in the first direction, the sub-pixel regions 122-R, 122-G, and 122-B are evaded to avoid blocking the sub-pixel regions. Further, when the wiring is implemented in the second direction, the sub-pixel regions 122-R, 122-G, and 122-B are also evaded to avoid blocking the sub-pixel regions. Therefore, a hexagonal trace evading region as shown in FIG. 3 appears near the sub-pixel regions. The process of forming the trace evading region will be described below with reference to FIG. 5. In FIG. 5, the plurality of first touch electrodes form three types of trace evading regions in order to evade the sub-pixel regions. Among them, the first type of trace evading region refers to that a part of the first touch electrodes surround the left edge of the sub-pixel region, and then continue to extend in the first direction, the second type of trace evading region refers to that a part of the first touch electrodes surround the right edge of the sub-pixel region, and then continue to extend in the first direction, and the third type of trace evading region refers to that the first touch electrodes sequentially pass through the first sub-slit b1 and the second sub-slit b2 as depicted in FIG. 5, or sequentially pass through the first sub-slit b1 and the third sub-slit b3 depicted in FIG. 5, and then continue to extend in the first direction. The third type of trace evading region of the first touch electrodes can be used to shield the slits between the sub-pixel regions, that is, the first trace evading region 701a of the first touch electrodes.

Similarly, the plurality of second touch electrodes would form three types of trace evading regions in order to evade the sub-pixel regions. The first type of trace evading region refers to that a part of the second touch electrodes surround the upper edge of the sub-pixel region, and then continue to extend in the second direction, the second type of trace evading region refers to that a part of the second touch electrodes surround the lower edge of the sub-pixel region, and then continue to extend in the second direction, and the third type of trace evading region refers to that a part of the second touch electrodes sequentially pass through the third sub-slit b3 and the second sub-slit b2 as depicted in FIG. 5, and then continue to extend in the second direction. The third type of trace evading region of the second touch electrodes can be used to shield the slits between the sub-pixel regions, that is, the second trace evading region 702a of the second touch electrodes.

The trace evading region for shielding the third slit may include a first trace evading region 701a of the first touch electrodes and a second trace evading region 702a of the second touch electrodes, where the orthographic projection of the first trace evading region on the base substrate covers the orthographic projection of the third slit b on the base substrate, thereby the third slit between adjacent sub-pixel regions may be shielded.

Figure 6:
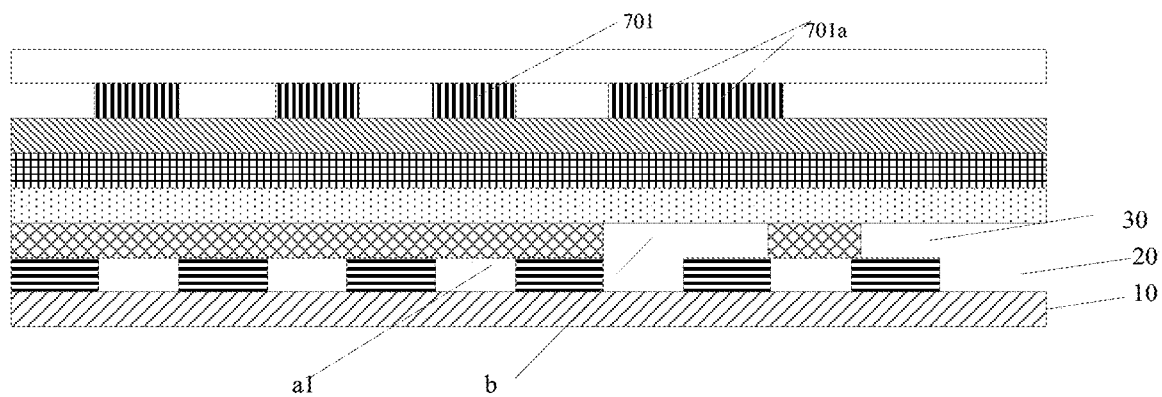
FIG. 6 is a schematic view showing that a touch function layer blocks other function layers according to an embodiment of the present disclosure.

The shielding relationship between the touch function layer 70 and the pixel driving circuit layer 20 will be further described below with reference to FIG. 6. Referring to FIG. 6, it is a schematic view showing that the touch function layer 70 blocks other function layers according to an embodiment of the present disclosure. The layer distribution shown in FIG. 6 is the same as that in FIG. 4. As shown in FIG. 6, the first slit a1 and the third slit b are in different functional layers, and the first slit a1 is a slit of the pixel driving circuit layer in the first direction y. The third slit b is a slit between the anode regions, and it can be shielded by the trace evading region 701a of the first touch electrodes 701 of the touch function layer 70. As shown in FIG. 6, the orthographic projection of the first touch electrodes 701 and the trace evading region 701a of the first touch electrodes 701 in the sub-pixel regions on the base substrate 10 can cover the orthographic projection of the first slit a1 and the third slit b on the base substrate 10. The light incident on the first slit and the third slit b can be shielded well by the touch electrodes of the touch function layer.

Figure 7:
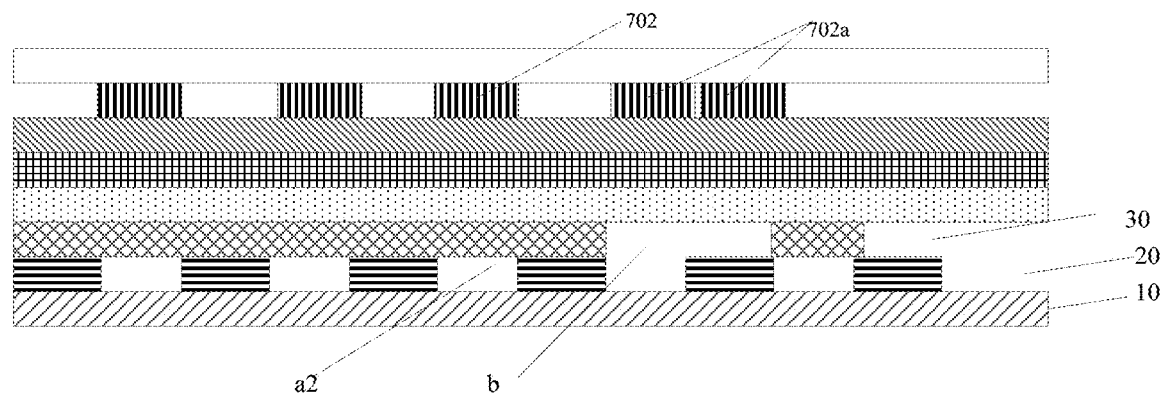
FIG. 7 is a schematic view showing that another touch function layer blocks other function layers according to an embodiment of the present disclosure.

Referring to FIG. 7, it is a schematic view showing that another touch function layer 70 blocks other function layers according to an embodiment of the present disclosure. The layer distribution shown in FIG. 7 is the same as that in FIG. 4. As shown in FIG. 7, the second slit a2 and the third slit b are in different functional layers, and the second slit a2 is a slit of the pixel driving circuit layer in the second direction x. The third slit b is a slit between the anode regions, and it can be shielded by the trace evading region 702a of the second touch electrode 702 of the touch function layer 70.

In the embodiments of the present disclosure, the shielding of the slits in other functional layers by the touch function layer effectively improves the imaging quality of the second display region. Compared with the related art, in which it is necessary to separately provide a shielding layer to shield the slits in different layers that cause light interference and diffraction problems, the embodiments of the present disclosure effectively shield the slits in different layers by only one touch function layer, which can effectively save the manufacturing process cost, while improving the imaging quality of the second display region.

Optionally, the area of the orthographic projection of the plurality of first touch electrodes of the touch function layer on the base substrate may be less than the area of the orthographic projection of the first trace regions on the base substrate, and the orthographic projection of the plurality of first touch electrodes on the base substrate at least covers an orthographic projection of all the slits of the first trace regions on the base substrate.

The area of the orthographic projection of the plurality of second touch electrodes of the touch function layer on the base substrate may be less than the area of the orthographic projection of the second trace regions on the base substrate, and the orthographic projection of the plurality of second touch electrodes on the base substrate at least covers the orthographic projection of all the slits of the second trace regions on the base substrate.

Optionally, the area of the orthographic projection of the plurality of first touch electrodes of the touch function layer on the base substrate is greater than or equal to the area of the orthographic projection of the first trace regions on the base substrate, and the area of the orthographic projection of the plurality of second touch electrodes of the touch function layer on the base substrate is greater than or equal to the area of the orthographic projection of the second trace regions on the base substrate. The area of the orthographic projection of the touch function layer on the base substrate completely covers the area of the orthographic projection of the first trace regions and the second trace regions on the base substrate.

In the embodiments of the present disclosure, the touch function layer is used to shield various slits existing in different function layers, which saves the process costs and effectively improves the imaging quality of the second display region.

Figure 8:
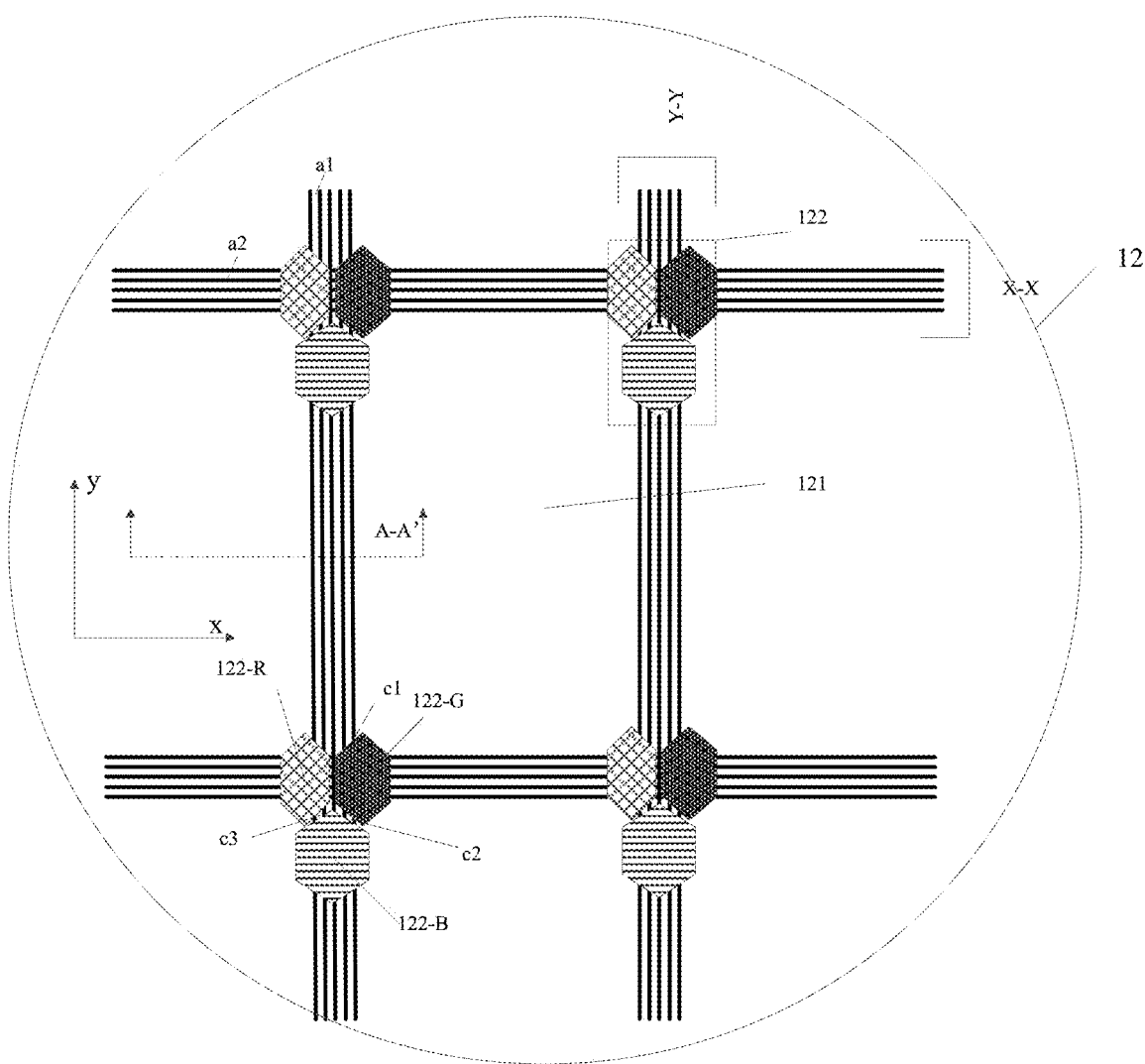
FIG. 8 is a schematic partial structural view of a second display region according to another embodiment of the present disclosure.

Optionally, referring to FIG. 8, it is a schematic partial structural view of a second display region according to another embodiment of the present disclosure. By increasing the area of the anode of each sub-pixel region, fourth slits exist between adjacent sub-pixel regions, the width of the fourth slits is smaller than the width of the orthographic projection of the touch function layer on the base substrate, the fourth slit is as shown in FIG. 8, and it includes a sub-slit c1, a sub-slit c2 and a sub-slit c3. The pixel cell region 122 includes a plurality of sub-pixel regions, and there are sub-slits with different widths between adjacent sub-pixel regions. The orthographic projection of these sub-slits on the base substrate is smaller than the orthographic projection of the sub-slits shown in FIG. 5 on the base substrate. For example, when the sub-slit c1 formed by only increasing the area of the sub-pixel region 122-R and the sub-pixel region 122-G is compared with the sub-slit b1 formed by the sub-pixel region 122-R and the sub-pixel region 122-G shown in FIG. 5, the orthographic projection of the sub-slit c1 on the base substrate is significantly smaller than that of the sub-slit b1 on the base substrate. It is also possible to simultaneously increase the areas of the sub-pixel region 122-R, the sub-pixel region 122-G, and the sub-pixel region 122-B to form the sub-slit c1, the sub-slit c2, and the sub-slit c3, and the orthographic projection of each sub-slit on the base substrate is smaller than the orthographic projection of the sub-slit at the corresponding position in FIG. 5 on base substrate.

In the embodiments of the present disclosure, by increasing the area of the anode, the orthographic projection of the multiple sub-slits included in the fourth slit on the base substrate is reduced, the surrounding amount of the first touch electrodes and the second touch electrodes in the sub-slit regions can be reduced, the width of the touch electrodes themselves may be directly utilized to shield the reduced-size sub-slits, thereby further saving the process costs and improving the shielding efficiency.

The trace evading regions of the first touch electrodes and the second touch electrodes of the touch function layer near the sub-pixel regions can better shield the multiple slits between these sub-pixel regions.

Optionally, each pixel cell region includes at least one pixel cell, and each pixel cell includes a plurality of sub-pixels of different emission colors; each sub-pixel includes a light emitting element, and the light emitting element includes an anode, a light emitting layer, and a cathode that are sequentially stacked.

It can be understood that the display panel according to the embodiments of the present disclosure may be a rigid panel or a flexible panel. When the display panel is a flexible panel, the base substrate includes a flexible substrate, which may be made from a flexible organic material, for example, polyimide (PI).

The display panel according to the embodiments of the present disclosure is suitable for a display device that requires a sensor to be placed under the screen, where the sensor may be a camera. The display device may be a tablet computer, a mobile phone, or the like.

Further, an embodiment of the present disclosure provides a display device including: the display panel as described in the foregoing embodiments; and a sensor, which is disposed in the second display region of the display panel and located on a side of the base substrate away from the pixel cells, and the sensor has a photosensitive surface which faces the display panel.

According to the display panel and the display device provided by the embodiments of the present disclosure, the display panel includes a first display region and a second display region, the second display region includes a plurality of light transmitting regions and a plurality of pixel cell regions, first trace regions extending in a first direction and second trace regions extending in a second direction, the first direction and the second direction intersect each other; first slits exist between two adjacent first traces in each first trace region, and second slits exist between two adjacent second traces in each second trace region; the display panel further includes: a base substrate and a touch function layer. In the embodiments of the present disclosure, the orthographic projection of the touch function layer on the base substrate covers the orthographic projection of the first slits and the second slits on the base substrate, so as to shield the slits in the first trace regions and the second trace regions, and prevent the influence of interference and diffraction caused by the incident light through the slits, which can effectively improve the imaging quality. Moreover, the embodiments of the present disclosure use the touch function layer to shield the slits, avoiding one process procedure, and effectively saving the process costs.

The above description only refers to the optional embodiments of the present disclosure and the explanation of the applied technical principles. Those skilled in the art should understand that the scope of the present disclosure is not limited to the technical solutions formed by the specific combination of the above technical features, but also covers other technical solutions formed by arbitrary combinations of the technical features or equivalent features thereof. For example, the scope of the present disclosure includes the technical solutions formed by replacing the above features with the technical features disclosed in the present disclosure (but not limited thereto) and having similar functions.

What is claimed is:

1. A display panel, comprising:
a first display region and a second display region, wherein the second display region comprises a plurality of light transmitting regions and a plurality of pixel cell regions, a first trace region is disposed in a first direction, the first trace region is configured to connect adjacent pixel cell regions in the first direction, a second trace region is disposed in a second direction intersecting the first direction, and the second trace region is configured to connect adjacent pixel cell regions in the second direction;
wherein the display panel further comprises: a base substrate and a touch function layer;
wherein in the second display region, the touch function layer comprises a plurality of first touch function structures and a plurality of second touch function structures;
wherein a first touch function structure in the plurality of first touch function structures extends in the first direction and is located in the first trace region;
wherein a second touch function structure in the plurality of second touch function structures extends in the second direction and is located in the second trace region;
wherein the first touch function structure in the plurality of first touch function structures and the second touch function structure in the plurality of second touch function structures are structures located in a same layer; and
wherein an orthographic projection of the first touch function structure on the base substrate does not overlap with an orthographic projection of the second touch function structure on the base substrate.

2. The display panel according to claim 1, wherein
a pixel driving circuit layer is disposed on the base substrate; and
wherein the pixel driving circuit layer comprises at least two first traces disposed apart from each other in the first trace region, and at least two second traces disposed apart from each other in the second trace region; and wherein the first touch function structure overlaps with the at least two first traces and a first slit between two adjacent first traces, and the second touch function structure overlaps with the at least two second traces and a second slit between two adjacent second traces.

3. The display panel according to claim 2, wherein the at least two first traces are configured to transmit a data signal or a power supply voltage signal to the pixel cell regions.

4. The display panel according to claim 2, wherein the at least two second traces are configured to transmit a scan signal, a light emission control signal or a reference voltage signal to the pixel cell regions.

5. The display panel according to claim 2, further comprising:
an anode layer, a light emitting layer, a cathode layer and an encapsulation layer sequentially disposed on the pixel driving circuit layer, and the touch function layer is disposed on the encapsulation layer,
wherein each of the at least two first traces of the pixel driving circuit layer is connected between two adjacent pixel cell regions, and each of the at least two second traces of the pixel driving circuit layer is connected between two adjacent pixel cell regions;
wherein an orthographic projection of a wiring of the touch function layer on the base substrate overlaps with an orthographic projection of the first and second slits on the base substrate; and
wherein an area of the pixel cell regions in the first display region is greater than an area of the pixel cell regions in the second display region.

6. The display panel according to claim 1, wherein
in the second display region, the touch function layer further comprises a plurality of third touch function structures;
wherein a third touch function structure in the plurality of third touch function structures surrounds a peripheral region of a pixel cell region in the plurality of pixel cell regions;
wherein the third touch function structures corresponding to two pixel cell regions adjacent in the first direction are electrically connected through the first touch function structure;
wherein the third touch function structures corresponding to two pixel cell regions adjacent in the second direction are electrically connected through the second touch function structure;
wherein the third touch function structure in the plurality of third touch function structures is electrically connected to two adjacent first touch function structures in the plurality of first touch function structures located on two opposite sides of the third touch function structure in the first direction, and the third touch function structure in the plurality of third touch function structures is electrically connected to two adjacent second touch function structures in the plurality of second touch function structures located on two opposite sides of the third touch function structure in the second direction; and
wherein a width of the first touch function structure in the plurality of first touch function structures in a direction perpendicular to an extension direction of the first touch function structure is greater than a width of the third touch function structure, and a width of the second touch function structure in the plurality of second touch function structures in a direction perpendicular to an extension direction of the second touch function structure is greater than the width of the third touch function structure.

7. The display panel according to claim 6, wherein the plurality of touch function structures, the plurality of second touch function structures and the plurality of third touch function structures are located in the same layer.

8. The display panel according to claim 6, wherein the third touch function structure comprises a mesh shape.

9. The display panel according to claim 6, wherein each of the plurality of pixel cell regions comprises a plurality of sub-pixel regions.

10. The display panel according to claim 9, wherein there are third slits between adjacent sub-pixel regions, and an orthographic projection of the third touch function structure on the base substrate overlaps with an orthographic projection of the third slits on the base substrate.

11. The display panel according to claim 9, wherein each of the plurality of sub-pixel regions is provided with a light emitting element, and the light emitting element comprises an anode, a light emitting layer and a cathode that are sequentially stacked.

12. The display panel according to claim 1, wherein the second display region is a multiplexing region for imaging and displaying.

13. The display panel according to claim 1, wherein the display panel is a flexible display panel.

14. The display panel according to claim 1, wherein the number of pixel cell regions per unit area in the first display region is greater than the number of pixel cell regions per unit area in the second display region.

15. The display panel according to claim 10, wherein the touch function layer comprises a plurality of first touch electrodes extending substantially in the first direction and a plurality of second touch electrodes extending substantially in the second direction, and the plurality of first touch electrodes and the plurality of second touch electrodes are formed with trace evading regions surrounding the sub-pixel regions.

16. The display panel according to claim 15, wherein each third slit comprises a first sub-slit, a second sub-slit, and a third sub-slit, each sub-slit is located between adjacent sub-pixel regions, the fact that the orthographic projection of the touch function layer on the base substrate overlaps with an orthographic projection of the third slits on the base substrate refers to:

in each trace evading region, an orthographic projection of the first touch electrodes on the base substrate overlaps with an orthographic projection of the first sub-slit and the second sub-slit connected to each other on the base substrate; or in each trace evading region, an orthographic projection of the first touch electrodes on the base substrate overlaps with an orthographic projection of the first sub-slit and the third sub-slit connected to each other on the base substrate; and in each trace evading region, an orthographic projection of the second touch electrodes on the base substrate overlaps with an orthographic projection of the second sub-slit and the third sub-slit connected to each other on the base substrate.

17. The display panel according to claim 15, wherein in the trace evading regions, the first touch electrodes surround edges of the sub-pixel regions.

18. The display panel according to claim 15, wherein in the trace evading regions, the second touch electrodes surround edges of the sub-pixel regions.

19. A display device, comprising:
the display panel according to claim 1; and
a sensor disposed at a position corresponding to the second display region of the display panel and on a side of the base substrate away from a light exit side of the display panel,
wherein the sensor has a photosensitive surface which faces the display panel.

* * * * *